United States Patent [19]

Kato et al.

[11] Patent Number: 4,857,742
[45] Date of Patent: Aug. 15, 1989

[54] POSITION DETECTING DEVICE USING VARIABLE RADIATION

[75] Inventors: Yuzo Kato, Yokohama; Yasuo Kawai, Shizuoka, both of Japan

[73] Assignee: Canon Kabushiki Kaisha, Tokyo, Japan

[21] Appl. No.: 136,419

[22] Filed: Dec. 22, 1987

[30] Foreign Application Priority Data

Dec. 27, 1986 [JP] Japan ................................. 61-309208

[51] Int. Cl.⁴ .......................................... H01J 37/304
[52] U.S. Cl. ................... 250/491.1; 250/492.2
[58] Field of Search ..................... 250/491.1, 310, 307, 250/492.2

[56] References Cited

U.S. PATENT DOCUMENTS 3,876,883  4/1975  Broers et al. ...................... 250/491.1
4,433,243  2/1984  Nakamura et al. .................. 250/397

FOREIGN PATENT DOCUMENTS 3228813  5/1983  Fed. Rep. of Germany .
57-31134  2/1982  Japan .................................. 250/492.2
60-133723  7/1985  Japan .................................. 250/492.2

Primary Examiner—Jack I. Berman
Attorney, Agent, or Firm—Fitzpatrick, Cella, Harper & Scinto

[57] ABSTRACT

A device for detecting the position of an object by use of an electron beam is disclosed. The device includes a beam supplying portion for supplying an electron beam, a scanning system operable to scan the object with the electron beam, a converting system operable to detect electrons from the object scanned with the electron beam and to convert the electrons into an electric signal, a detecting system operable to detect the position of the object on the basis of the signal from the converting system, and a control unit actable on the supplying portion to change, during the scan of the object, a condition for the irradiation of the object with the electron beam in accordance with the characteristic of the object.

28 Claims, 3 Drawing Sheets

POSITION DETECTING DEVICE USING VARIABLE RADIATION

FIELD OF THE INVENTION AND RELATED ART

This invention relates to a device for observing an object and, more particularly, to a device for detecting the position of an object by use of radiation such as an electron beam. The position detecting device of the present invention is particularly suitably usable in a semiconductor microcircuit manufacturing exposure apparatus, for detecting the positional relation between two objects such as a reticle (or mask) and a wafer. In another aspect, the present invention is concerned with an alignment system having a position detecting system using a radiation beam such as an electron beam, for aligning a mask and a wafer in accordance with the detection by the position detecting system.

In the field of manufacture of semiconductor microcircuits, many types of exposure apparatuses such as optical aligners, X-ray aligners, electron-beam patterning apparatuses and so on are used. In these apparatuses, usually mask-to-wafer alignment is effected prior to the initiation of the exposure of a wafer (or each shot area of the wafer). For this alignment, alignment marks provided on a mask and a wafer and representing the positional relation between the mask and the wafer are first detected by use of a laser beam or an electron beam, so that the positional relation between the mask and the wafer at that time is determined. Then, in accordance with any error in the thus determined positional relation of the mask and the wafer with respect to a certain preset reference positional relation, the mask and the wafer are relatively moved whereby they are aligned.

Usually, an alignment mark provided on a wafer is defined by a step structure (recess or protrusion) formed in or on the surface of the wafer substrate. Since each wafer is coated with a photoresist material for the photolithographic transfer of a mask pattern, there exists such a resist layer on the wafer surface at the time of the mask-to-wafer alignment. Accordingly, the alignment mark of the wafer has to be detected through or by way of the resist layer.

On the other hand, a mask is usually provided by a glass substrate or a membrane of a material such as $Si_3N_4$ or similar material on which a circuit pattern is formed. No surface layer such as the resist layer is provided on the mask. Accordingly, the alignment mark of the mask can be observed directly, as compared with the observation of the wafer alignment mark.

FIG. 1 is a view showing the manner of detecting the relative position of a mask and a wafer by use of an electron beam. In FIG. 1, a mask has an alignment mark comprising alignment mark patterns 1 and 2, while a wafer has an alignment mark comprising alignment mark patterns 4 and 5. These mark patterns of the mask and the wafer are scanned with an electron beam along a scan line 6. Reference numeral 3 denotes an opening formed in the mask, through which the scanning electron beam is projected upon the mark patterns 4 and 5 of the wafer.

In the FIG. 1 example, the mask and the wafer are spaced from each other by a predetermined gap or distance. After completion of the mask-to-wafer alignment, the mask is illuminated by use of a predetermined radiation, such that a circuit pattern formed on the mask is transferred or printed on a resist layer applied to the wafer surface.

In response to the scan of the alignment mark patterns 1, 2, 4 and 5 of the mask and the wafer with the electron beam, there occur reflected electrons and/or secondary electrons from each alignment mark pattern. These electrons are detected by one or more detectors, whereby the position of the wafer with respect to the mask (or vice versa) can be discriminated.

SUMMARY OF THE INVENTION

It has been considered that the detection of an alignment mark by use of an electron beam has a high possibility of ensuring very accurate detection of the position of an object being examined. However, the inventors of the subject application have found that the highest detection accuracy is not always attainable. Particularly, when the electron beam scan is used for the mark detection in the mask-to-wafer alignment, it has been found that there is a difficulty in ensuring the highest accuracy both for the detection of an alignment mark of a mask and for the detection of an alignment mark of a wafer. It is considered that such difficulty chiefly results from the difference in the characteristics of the mask and the wafer, in relation to the irradiation of the electron beam.

It is accordingly a primary object of the present invention to provide a position detecting device by which highest position detecting accuracy is ensured regardless of the object being examined.

It is another object of the present invention to provide a position detecting device using radiation such as an electron beam, by which the positional relation between two different objects can be detected very accurately and with certainty.

It is a further object of the present invention to provide an observation device using radiation such as an electron beam, by which different portions of an object having different characteristics or different objects having different characteristics can be observed very precisely or sharply, regardless of the difference in the characteristics.

In accordance with an aspect of the present invention, to achieve at least one of these objects, there is provided a device for detecting the position of an object by use of an electron beam, said device comprising:

supplying means for supplying an electron beam;

scanning means operable to scan the object with the electron beam;

converting means operable to detect electrons from the object scanned with the electron beam and to convert the electrons into an electric signal;

detecting means operable to detect the position of the object on the basis of the signal from said converting means; and control means actable on said supplying means to change, during the scan of the object, a condition for the irradiation of the object with the electron beam in accordance with the characteristic of the object.

In accordance with another aspect of the present invention, there is provided a device for observing an object by use of an electron beam, said device comprising:

supplying means for supplying an electron beam so as to irradiate the object with the electron beam;

receiving means for receiving electrons from the object irradiated with the electron beam to thereby observe the object; and control means actable on said supplying means to change a condition for the irradiation of the object with the electron beam in accordance with the characteristic of the object.

In accordance with a further aspect of the present invention, there is provided a position detecting device which is operable to detect the positional relation between two, namely first and second objects by use of an electron beam. Electron beam supplying means is provided and is adapted to irradiate the first and second objects with an electron beam for the detection of the relative position of the first and second objects. Specifically, the electron beam supplying means is arranged so that the beam irradiation condition can be changed for the irradiation of the first object and for the irradiation of the second object. This allows that, for the detection of the relative position of the first and second objects, both the first object and the second object are irradiated with the electron beam under respective optimum conditions.

As for such irradiation conditions to be controlled, there may be an acceleration voltage for the electron beam, a filament current, a spot diameter of the irradiating electron beam and so on.

The irradiation condition or conditions for the electron beam may be controlled by a combination of an electron detector adapted to detect reflected electrons and/or secondary electrons which are caused in response to the irradiation of the first and second objects with the electron beam, an irradiated-position detector adapted to detect the position being irradiated with the electron beam on the basis of an electric signal supplied from the electron detector, and a controller adapted to control the electron beam supplying means so as to controllably change the irradiation condition or conditions on the basis of the result of detection of the position being irradiated with the electron beam. The control of the irradiation condition in the described manner is convenient because the timing for setting or changing the irradiation condition can be easily determined on the basis of the position upon which the electron beam is incident. Further, suitable memory means may be provided so that optimum conditions for the irradiation of the first and second objects can be stored into the memory in preparation for the detection. This ensures facilitated control of the irradiation condition since the electron beam supplying means can be controlled in accordance with the stored information.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
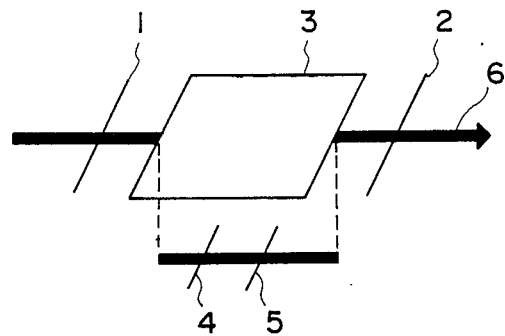
FIG. 1 is a view explicating the manner of scanning of a mask alignment mark and a wafer alignment mark with an electron beam, for the detection of the relative position of these marks.
Figure 2:
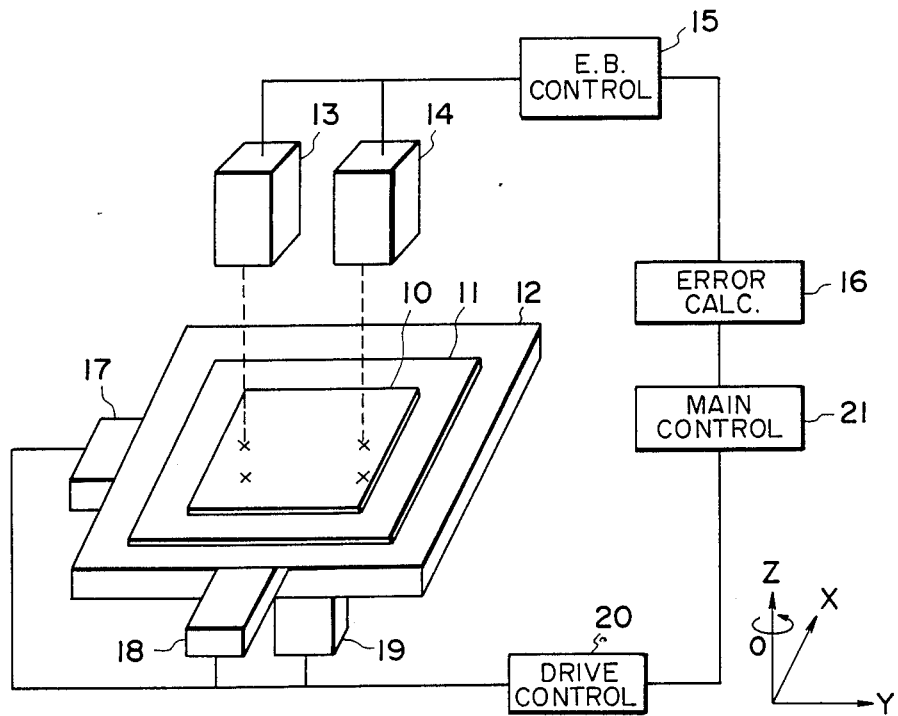
FIG. 2 is a schematic and diagrammatic view of a position detecting device according to one embodiment of the present invention, wherein the position detecting device is incorporated into a mask aligner.

Referring to FIG. 2, there is shown a position detecting device according to an embodiment of the present invention. In this embodiment, the position detecting device is incorporated into a mask aligner.

Denoted at 10 in FIG. 2 is a mask having a circuit pattern. A wafer 11 is held by a wafer stage 12 which is movable in X and Y directions as well as in a rotational direction ($\theta$ direction). The position detecting device includes a pair of electron-beam optical units 13 and 14 each for providing a scanning electron beam toward the mask 10. The device further includes an electron-beam projected control unit 15 for controlling the electron-beam optical units 13 and 14, and an error calculating device 16 adapted to calculate any positional error between the mask 10 and the wafer 11. Drive units 17, 18 and 19 are adapted to move the wafer stage 12 in the X, Y and $\theta$ directions, respectively. A driving system controller 20 is provided to control the drive units 17-19 in accordance with the result of calculation made by the error calculating device 16, thereby to establish a predetermined positional relation between the mask and the wafer. Main controller 21 is provided for the sequence control of the position detecting device as a whole, and controls the electron-beam controller 15, the error calculating device 16, the driving system controller 20 and so on.

The electron-beam optical devices 13 and 14 are movable in an X-Y plane and, when the mask 10 is going to be illuminated with an "exposure" radiation for transferring the circuit pattern of the mask 10 onto the wafer 11, the optical devices 13 and 14 are retracted to such positions that they do not interfere with the illumination of the mask 10 with the exposure radiation. While not shown in the drawing, there are provided driving means for moving the optical devices 13 and 14 and illumination means for supplying the exposure radiation toward the mask 10. These unshown driving means and illumination means are also controlled by the main controller 21 by way of signal lines, not shown. As for the exposure radiation, ultraviolet rays, X-rays, an electron beam or otherwise is usable.

Figure 3:
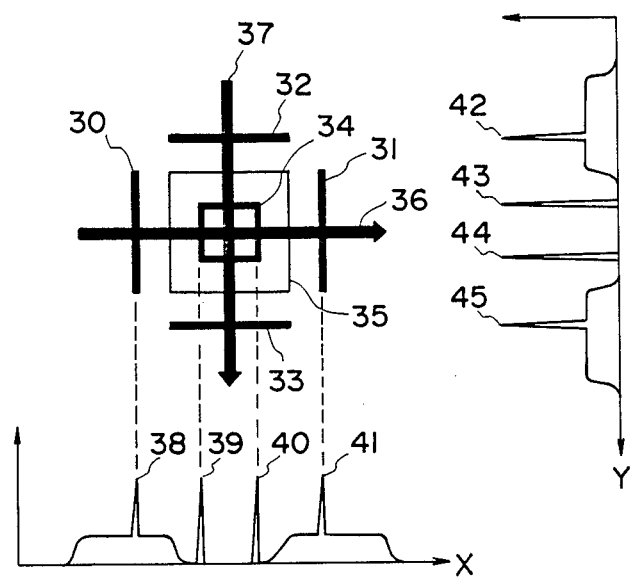
FIG. 3 is a schematic view showing the manner of scanning of alignment marks with electron beams in the device of the FIG. 2 embodiment and showing electric signals obtainable from the electron beam scan.

FIG. 3 schematically shows the manner of scanning of mating alignment marks, provided on the mask 10 and the wafer 11, by use of one of the electron-beam optical devices 13 and 14 of the FIG. 2 embodiment. In the illustrated example of FIG. 3, reference numerals 30, 31, 32 and 33 denote mark patterns formed on the mask 10. Reference numeral 34 denotes an alignment mark formed on the wafer 11 that mates with the mask alignment mark comprising the mark patterns 30-33. Reference numeral 35 denotes an opening formed in the mask for allowing passage of an electron beam toward the alignment mark of the wafer. As illustrated, the mark patterns 30-33 of the mask alignment mark and the mark pattern of the wafer alignment mark 34 are scanned with the electron beam along scan lines 36 and 37 which extend orthogonally in the X-Y plane. When the scanning electron beam scanningly deflected along the scan lines 36 and 37 impinges upon each mark pattern, there occur reflected electrons and/or secondary electrons from the mark pattern. These electrons are detected by an electron detector which may comprise a scintillator photomultiplier or similar device, whereby they are converted into electric signals. Thus, as a result of the scan of the mark patterns with the electron beam, there are produced pulse-like signals such as depicted in FIG. 3.

The electron-beam optical devices 13 and 14 of the FIG. 2 embodiment are adapted to observe two locations on each of the mask 10 and the wafer 11, such that each of the electron-beam optical devices 13 and 14 detects pulse-like electric signals such as at 38–45 shown in FIG. 3, from corresponding alignment marks of the mask and the wafer. Details of the electron-beam optical devices 13 and 14 will be described later. Also, as will be described later, the electron beam scan and the condition or conditions for the electron beam irradiation by the electron-beam optical devices 13 and 14 are controlled under the influence of the controller 15. The error calculating device 16 receives the detected pulse-like electric signals 38–45 and measures the intervals between them. Thus, on the basis of the pulse signals 38–41, the calculating device 16 detects any positional error in the X direction with respect to a predetermined reference. Also, from the pulse signals 42–45, the calculating device 16 detects any positional error in the Y direction with respect to the reference.

As an example for such detection of the positional error, the interval between the signals 38 and 39 may be compared with the interval between the signals 40 and 41. Alternatively, the mid point between the signals 38 and 41 may be compared with the mid point between the signals 39 and 41. By doing so, the relative positional deviation between the mask and the wafer with respect to the X direction is detectable. The relative positional deviation with respect to the Y direction is detectable similarly.

The position detection described with reference to FIG. 3 is carried out for each of the two locations on the mask 10 (and thus on the wafer 11). Thus, by detecting the positional errors for the two locations, any positional error with respect to the θ (rotational) direction as well as the X and Y directions can be determined.

The driving system controller 20 actuates the driving units 17–19 to controllingly move the wafer stage 12, carrying thereon the wafer 11, so as to correct the thus determined positional error. By this, the wafer 11 is aligned with the mask 10.

The operational relation between each electron-beam optical device and the electron-beam control unit will now be described, in conjunction with FIG. 4.

Figure 4:
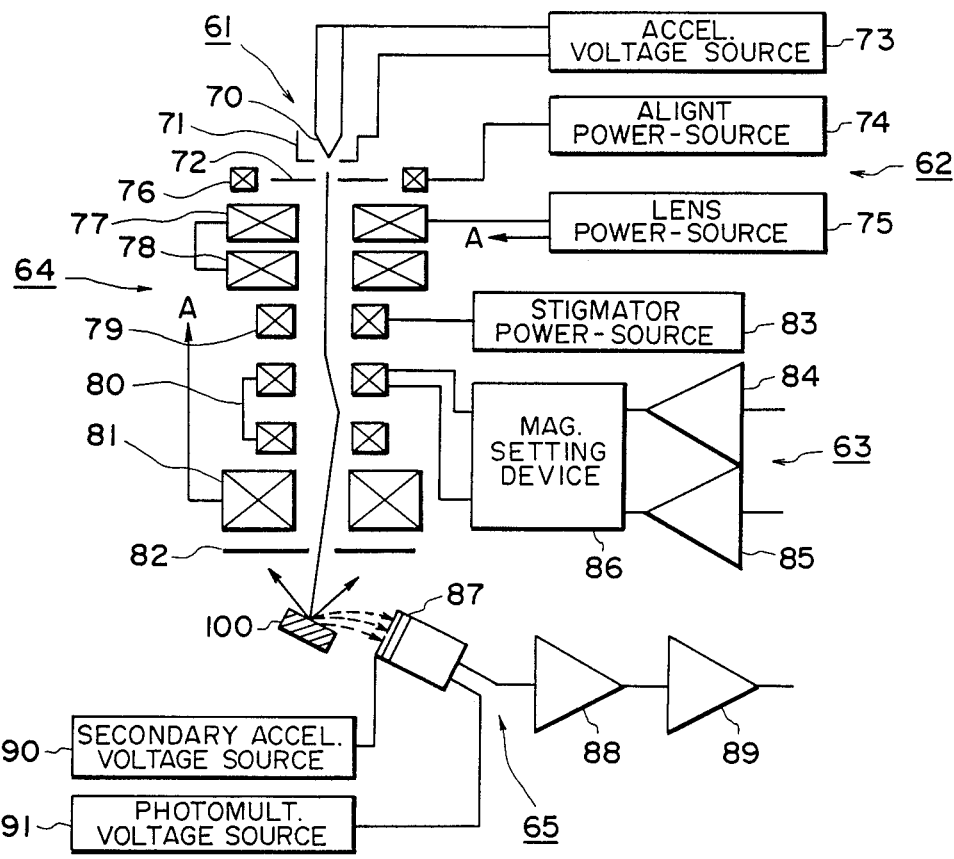
FIG. 4 is a schematic and diagrammatic view showing details of an electron-beam optical device included in the position detecting device of the FIG. 2 embodiment.

FIG. 4 shows an example of an electron-beam optical device which is usable in the FIG. 2 embodiment. The electron-beam optical device of the example comprises a portion 61 operable to produce an electron beam, a portion 62 operable to set the condition for the irradiation of an object to be examined with the electron beam, a portion 63 operable to control the scan line, a portion 64 operable to transmit the electron beam and a portion 65 operable to detect reflected electrons and/or secondary electrons and for converting them into electric signals.

The electron beam producing portion 61 includes a filament 70, a Wehnelt cathode 71 and an anode 72. The irradiation condition setting portion 62 includes an acceleration voltage source 73, an alignment power source 74 and a lens power source 75. The electron beam transmitting portion 64 includes an alignment coil 76, a first converging lens 77, a second converging lens 78, a stigmator 79, deflecting coils 80, an objective lens 81 and an objective stop 82. The stigmator 79 is driven by a stigmator power source 83. The scan line controlling portion 63 includes an X-direction deflecting amplifier 84, a Y-direction deflecting amplifier 85 and a magnification setting device 86. The converting portion 65 includes a scintillator photomultiplier 87, a preamplifier 88 and a main amplifier 89. The scintillator photomultiplier 87, as is well known in the art, has a photoelectric converting function as well as a function of "catching" secondary electrons from a sample 100 such as a mask or a wafer. These functions can be adjusted by means of a secondary acceleration voltage source 90 and a photomultiplier voltage source 91.

The fundamental structure of the electron beam optical device as illustrated in FIG. 4 is essentially the same as that of a scanning electron microscope (SEM) which is well known in the art. Therefore, further details of the structure of the electron beam optical device will be omitted here, for simplicity.

It should be noted that the speed of electrons emitted from the filament 70 (i.e. the energy of electrons) can be changed by controlling the electric potential of the anode 72 by means of the acceleration voltage source 73. On the other hand, the diameter of the electron beam (i.e. the spot size of the electron beam impinging on the sample 100) can be changed by controlling an electric current supplied to the alignment coil 76, by adjusting the alignment power source 74. Further, the lens power source 75 is operable to act on the first and second converging lenses 77 and 78, such that the spot size of the electron beam can be changed under the influence of the lens power source 75. Additionally, the acceleration voltage source 73 can control the supply of the electric current to the filament 70, such that the number of electrons to be emitted from the filament 70 can be adjusted.

In the position detecting device of the present embodiment, the irradiation condition for the electron beam is controlled by the irradiation condition setting portion 62. More specifically, in this portion 62, the acceleration voltage source 73, the alignment power source 74 and the lens power source 75 are adjusted suitably to thereby determine the acceleration voltage for the electron beam, the filament current at the filament 70 and the spot diameter of the electron beam, as desired. Details of the control of the irradiation condition will be described in conjunction with the block diagram of FIG. 5.

Figure 5:
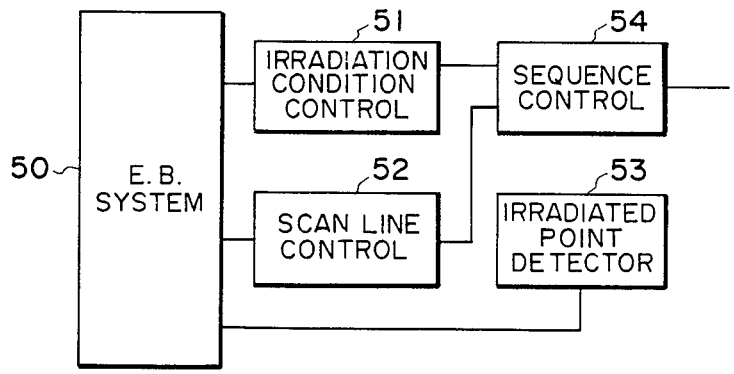
FIG. 5 is a block diagram of a control system of the FIG. 2 embodiment which system comprises an electron-beam optical device and an electron-beam controller.

In FIG. 5, an electron beam optical device is denoted at 50. As illustrated, the system includes an irradiation condition controlling circuit 51, a scan line controlling circuit 52 and a detector 53 operable to detect the position being irradiated. A sequence controlling circuit 54 is provided to control the irradiation condition controlling circuit 51, the scan line controlling circuit 52 and the irradiation position detector 53. The irradiation condition controlling circuit 51 includes a suitable storing means such as a random access memory (RAM), a read only memory (ROM) or similar device, for storing therein optimum irradiation conditions related to an object which is going to be examined. The electron beam control 15 shown in FIG. 2 is provided by the irradiation condition controlling circuit 51, the scan line controlling circuit 52, the irradiation position detector 53 and the sequence controlling circuit 54 as described.

First, the scan start point of the scanning electron beam is set in this embodiment so that it is located on the mask 10 surface. Accordingly, in operation, the irradiation condition controlling circuit 51 operates to control the irradiation condition setting portion 62 to thereby suitably set the acceleration voltage, the filament current and the spot diameter so that optimum signals are obtainable from the alignment mark of the mask 10. For example, for an ordinary mask having a glass substrate, the acceleration voltage is preferably set not greater than approx. 10 KeV. This is preferable because the acceleration voltage of such level does not cause undesirable "charge-up" and damage of the mask.

As a result of the electron beam scan and at a moment at which the scanning electron beam, scanning along the scan line 36 (FIG. 3), impinges upon the mark pattern 30 of the mask alignment mark, a pulselike signal such as denoted at 38 in FIG. 3 is produced. The pulselike signal 38 is detected by the irradiation position detector 53, as a variation in level of the outputted electric signal. The mark pattern 30 of the mask alignment mark has a fixed positional relation (which is predetermined) with the opening 35 formed in the mask. Further, the opening 35 itself has a predetermined size (width in the direction of the scan line). Therefore, the electron beam starts irradiating the wafer 11 at a predetermined delay after the irradiation of the mark pattern 30 of the mask 10. Also, the irradiation of the wafer continues for a constant time period.

Namely, with the aforesaid predetermined delay after the pulse-like signal representing the position of the mark pattern 30 is detected by the irradiation position detector 53, the electron beam starts irradiating the wafer 11 and the irradiation of the wafer 11 continues for the aforesaid constant time period. In consideration thereof, the sequence controlling circuit 54 operates to control the irradiation condition setting portion 62 at such timing that corresponds to the start of irradiation of the wafer 11 with the electron beam, thereby suitably to set the acceleration voltage, the filament current and the spot diameter so that optimum signals are obtainable from the alignment mark of the wafer 11. For example, the acceleration voltage is preferably set not less than 20 KeV.

After the irradiation of the wafer 11, the scanning electron beam again irradiates the mask 10 so as to detect the mark pattern 31 of the mask. At this time, the irradiation condition is of course changed by the irradiation condition setting portion 62 so that optimum signals are obtainable from the mask mark pattern 31.

In the manner described hereinbefore, the irradiation condition is controllingly changed during "one scan" by the electron beam, and such control is made under the governance of the sequence controlling circuit 54. It is added that the spot diameter of the electron beam is preferably set so as to be smaller than the width of the mark pattern of the mask 10 or the wafer 11 in the direction of the scan line. Further, with regard to the scan line 37 which extends orthogonally to the scan line 36, the position detection for the mark patterns of the mask and the wafer is carried out in a similar manner as described hereinbefore.

In accordance with the present embodiment, as described in the foregoing, the position detection using an electron beam is carried out while changing the irradiation condition in the course of the irradiation of the subject being examined. Namely, for different subjects, the optimum irradiation condition differs since different subjects have different characteristics (more specifically, different electron emission characteristics and/or electron absorption characteristics). This is chiefly because of the difference in the material, structure and the like of the subjects to be examined. In the present embodiment, in consideration thereof, the optimum irradiation condition for a particular subject is predetected and is stored in preparation into a memory means in the irradiation condition controlling circuit. At the time of measurement or position detection, the subject to be examined is designated so that, in accordance with the designated subject, an optimum irradiation condition is set by the irradiation condition controlling circuit. Therefore, in the position detecting device of the present embodiment, each subject can be examined with an optimum irradiation condition.

While, in the above-described embodiment, the position detecting device is used to detect the positional relation between the mask 10 and the wafer which are disposed in the direction of an "optical axis" defined by the electron beam optical device 13 or 14, the present invention is not limited thereto. Namely, the principle of the present invention is effectively applicable to observation of two objects lying in the same plane perpendicular to the optical axis. Namely, by irradiating such two objects with a scanning electron beam, high-accuracy observation or high-accuracy position detection, if it is desired, is attainable. Further, it will be readily understood that the principle of the present invention is effectively applicable to observation of different portions of one and the same object, even if the different portions show different characteristics in relation to the electrons.

In the embodiment described hereinbefore, the subjects of the electron beam scan are a mask and a wafer whose characteristics are predetected. Accordingly, the information concerning the characteristics of the mask and the wafer is stored into the memory means of the irradiation condition controlling circuit in preparation for detection, such that the electron beam scan of the mask and the wafer is carried out under the variable optimum irradiation condition with regards to the mask and the wafer. If, on the other hand, the characteristics in relation to the electron beam irradiation such as the electron emission characteristics and/or the electron absorption characteristics of different objects or different portions of one and the same object (which are the subjects of examination by use of the electron beam scan) are not detected ahead of time, the irradiation condition may be set in the following manner:

First, each object or each portion of the object is irradiated with or, if desirable, is scanned with an electron beam and the electrons (or rays of electrons) from the object or the portion of the object are detected by use of an electron detector. Then, on the basis of signal intensity, contrast, etc., of the output of the electron detector, the electron emission characteristics of the examined object or the examined portion of the object are detected. Such characteristics detection is attainable in a processing circuit which may be included in the electron beam controller shown in FIG. 2. In accordance with the thus detected characteristics of the different objects or the different portions of the same object, optimum irradiation conditions for the respective subjects are determined in the processing circuit. The information concerning the thus determined optimum irradiation conditions is stored into the memory means included in the irradiation condition setting circuit, as described hereinbefore.

Thereafter, the actual examination is carried out for the different objects or the different portions of the same object with the variably controlled irradiation of the electron beam. This is made in the same manner as described hereinbefore. Thus, each subject can be observed with high precision and certainty.

In the embodiment described with reference to FIGS. 2 and 3, the signal corresponding to the first mark pattern (30) of the mask is used as a reference for determining the "timetable" for the scan of the mask and the wafer. If, however, a particular position on the mask is preselected as the starting point for the scan, the timing and the time period for the irradiation of the wafer with the electron beam are predetermined fixedly. As a result, the irradiation position detector included in the FIG. 2 embodiment may be omitted.

Further, in the embodiment described with reference to FIGS. 2 and 5, the irradiation position detector detects the position being irradiated, on the basis of a signal from a mark pattern. However, under the same irradiation condition, the pedestal signal component changes when the mask is irradiated and when the wafer is irradiated. In consideration thereof, the position being irradiated with the electron beam can be detected from the point of change in the pedestal signal component.

In accordance with the present invention, as has hitherto been described, the electron beam supplying means supplies an electron beam toward an object to be examined with a variable irradiation condition, such that under the optimum condition a signal related to the object is obtainable.

While the invention has been described with reference to the structures disclosed herein, it is not confined to the details set forth and this application is intended to cover such modifications or changes as may come within the purposes of the improvements or the scope of the following claims.

What is claimed is:

1. A mark detecting device for detecting a first alignment mark formed on a first object and a second alignment mark of a second object that is to be aligned with the first object, said device comprising:
   supplying means for supplying an electron beam to irradiate the first and second alignment marks with the electron beam;
   control means operable to control said supplying means; and
   detecting means for detecting the first and second alignment marks on the basis of the irradiation of the first and second alignment marks with the electron beam;
   wherein said control means is operable to cause said supplying means to change the condition of irradiation of the first and second alignment marks in accordance with the response characteristics of the marks to be received electrons, so that the first and second alignment marks are irradiated with the electron beam under different irradiation conditions.

2. A device according to claim 1, wherein said detecting means includes converting means operable to detect electrons from the first and second alignment marks irradiated with the electron beam and to convert the detected electrons into electric signals.

3. A device according to claim 2, wherein said supplying means includes a deflector operable to deflect the electron beam so that the first and second alignment marks are scanned with the electron beam.

4. A device according to claim 3, wherein said control means is operable to act upon said supplying means in accordance with the scanning deflection of the electron beam.

5. A device according to claim 4, wherein said control means is operable to act upon said supplying means so as to change the energy of the electron beam for the irradiation of the first alignment mark and for the irradiation of the second alignment mark.

6. A device according to claim 5, wherein said control means is operable to act upon said supplying means so as to change a spot diameter of the electron beam for the irradiation of the first alignment mark and for the irradiation of the second alignment mark.

7. A device according to claim 6, wherein said control means is operable to act upon said supplying means so as to change the number of electrons of the electron beam for the irradiation of the first alignment mark and for the irradiation of the second alignment mark.

8. A device according to claim 4, wherein the irradiation condition is changed on the basis of the detection of the first alignment mark.

9. A device according to claim 8, wherein said control means includes memory means in which the irradiation condition is stored prior to detection by said detecting means.

10. A device according to claim 2, wherein the first alignment mark is formed on a mask and the second alignment mark is formed on a wafer and wherein said supplying means has an optical axis along which the mask and the wafer are disposed.

11. A device according to claim 10, wherein said supplying means includes a deflector for deflecting the electron beam so as to scan the first and second alignment marks with the electron beam being deflected.

12. A device according to claim 11, wherein said detecting means is operable to detect the positional relation between the first alignment mark and the second alignment mark, on the basis of electrons from the first alignment mark and electrons from the second alignment mark.

13. A device according to claim 12, wherein said control means is operable to act upon said supplying means so as to change the energy of the electron beam for the irradiation of the first alignment mark and for the irradiation of the second alignment mark.

14. A device according to claim 1, wherein said supplying means includes a deflector for deflecting the electron beam so as to scan the first and second alignment marks with the deflected electron beam.

15. A device according to claim 14, wherein said control means is operable to change the energy of the electron beam for the irradiation of the first alignment mark and for the irradiation of the second alignment mark.

16. A device according to claim 1, wherein said control means is operable to cause said supplying means to change the irradiation condition in accordance with an electron emission characteristic of each alignment mark.

17. A device according to claim 1, wherein said control means is operable to cause said supplying means to change the irradiation condition in accordance with an electron absorption characteristic of each alignment mark.

18. A device according to claim 1, wherein said control means is operable to cause said supplying means to change the irradiation condition in accordance with an electron reflection characteristic of each alignment mark.

19. A device according to claim 1, wherein the first object is a mask and the second object is a wafer, and wherein an output signal from said detecting means is used for the alignment of the mask and the wafer.

20. A device according to claim 1, wherein said detecting means detects electrons from the first and second alignment marks and wherein said control means operates in accordance with an output signal from said detecting means to set an irradiation condition for each alignment mark.

21. A device according the claim 20, wherein said supplying means includes deflecting means for deflecting the electron beam to scan the first and second alignment marks with the electron beam, and wherein said control means operates to cause said supplying means to change the condition for irradiation of the first and second alignment marks in a timed relationship with the deflection of the electron beam by said deflecting means.

22. A mark detecting apparatus for detecting a first alignment mark formed in a portion of a first object and second alignment mark formed in a portion of a second object, which is to be aligned with the first object, said apparatus comprising;

an irradiating device for irradiating each said portion of the first and second objects with an electron beam;

an adjusting device operable to act upon said irradiating device to adjust the irradiation of the portions of the first and second objects by said irradiating means, in accordance with respective response characteristics to received electrons of the said portions of the first and second objects, wherein the said portions of the first and second objects have different response characteristics; and a detecting system for detecting each alignment mark on the basis of the irradiation as adjusted by said adjusting device, of each said portion of the first and second objects with the electron beam.

23. An apparatus according to claim 22, wherein said adjusting device operates to cause said irradiating device to adjust the irradiation of each said portion of the first and second objects in accordance with an electron emission characteristic of that portion.

24. An apparatus according to claim 22, wherein said adjusting device operates to cause said irradiating device to adjust the irradiation of each said portion of the first and second objects in accordance with an electron absorption characteristic of that portion.

25. An apparatus according to claim 22, wherein said adjusting device operates to cause said irradiating device to adjust the irradiation of each said portion of the first and second objects in accordance with an electron reflection characteristic of that portion.

26. An apparatus according to claim 22, wherein the first object is a mask and the second object is a wafer, and wherein an output signal from said detecting system is used for the alignment of the mask and the wafer.

27. An apparatus according to claim 22, wherein said detecting system detects electrons from the first and second alignment marks and wherein said adjusting device operates in accordance with an output signal from said detecting system to set an irradiation condition for each portion.

28. An apparatus according to claim 27, wherein said irradiating device includes a deflector for deflecting the electron beam to scan the portions of the first and second objects with an electron beam, and wherein said adjusting device operates to cause said irradiating device to adjust the irradiation of the said portions of the first and second objects in a timed relationship with the deflection of the electron beam by said deflector.

* * * * *

UNITED STATES PATENT AND TRADEMARK OFFICE
CERTIFICATE OF CORRECTION

PATENT NO. : 4,857,742

DATED : August 15, 1989

INVENTOR(S) : YUZO KATO, ET AL.

It is certified that error appears in the above-identified patent and that said Letters Patent is hereby corrected as shown below:

COLUMN 3

Line 57, "explicating" should read --for explaining--.

COLUMN 4

Line 21, "beam toward" should read --beam projected toward--.
    Line 23, "projected" should be deleted.
    Line 28, "0 directions," should read --$\theta$ directions,--.

COLUMN 5

Line 62, "beam" should read --beam,--.

COLUMN 9

Line 17, "predetermined" should read --predetermined.--.
    Line 18, "fixedly." should be deleted.

UNITED STATES PATENT AND TRADEMARK OFFICE
CERTIFICATE OF CORRECTION

PATENT NO. : 4,857,742
DATED : August 15, 1989
INVENTOR(S) : YUZO KATO, ET AL.

It is certified that error appears in the above-identified patent and that said Letters Patent is hereby corrected as shown below:

COLUMN 11

Line 29, "second alignment mark" should read
         --a second alignment mark--.
    Line 31, "comprising;" should read --comprising:--.

Signed and Sealed this

Nineteenth Day of November, 1991

Attest:

HARRY F. MANBECK, JR.

Attesting Officer     Commissioner of Patents and Trademarks